(12) United States Patent
Morgner et al.

(10) Patent No.: US 9,443,703 B2
(45) Date of Patent: Sep. 13, 2016

(54) APPARATUS FOR GENERATING A HOLLOW CATHODE ARC DISCHARGE PLASMA

(71) Applicant: Fraunhofer-Gesellschaft zur Förderung der angewandten Forschung e.V., Munich (DE)

(72) Inventors: Henry Morgner, Dresden (DE); Gösta Mattausch, Ullersdorf (DE); Christoph Metzner, OT Pappritz (DE); Michael Junghähnel, Dresden (DE); Rainer Labitzke, Dresden (DE); Lars Klose, OT Weiβig (DE); Torsten Werner, Dresden (DE); Jörg Kubusch, Dresden (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 0 days.

(21) Appl. No.: 14/362,397

(22) PCT Filed: Oct. 17, 2012

(86) PCT No.: PCT/EP2012/070535
§ 371 (c)(1),
(2) Date: Jun. 2, 2014

(87) PCT Pub. No.: WO2013/091927
PCT Pub. Date: Jun. 27, 2013

(65) Prior Publication Data
US 2014/0354149 A1    Dec. 4, 2014

(30) Foreign Application Priority Data

Dec. 19, 2011   (DE) .................. 10 2011 121 386

(51) Int. Cl.
| | |
|---|---|
| *H01J 7/24* | (2006.01) |
| *H01J 37/32* | (2006.01) |
| *H05H 1/48* | (2006.01) |

(52) U.S. Cl.
CPC .... *H01J 37/32568* (2013.01); *H01J 37/32055* (2013.01); *H01J 37/32064* (2013.01);
(Continued)

(58) Field of Classification Search
CPC ........................................................ H01J 37/32
USPC ......................... 315/111.21, 111.41, 111.51
See application file for complete search history.

(56) References Cited

U.S. PATENT DOCUMENTS

| | | | |
|---|---|---|---|
| 3,952,228 A | 4/1976 | Reader et al. | |
| 4,277,721 A * | 7/1981 | Kosmahl ............ | H01J 23/0275 315/3.6 |

(Continued)

FOREIGN PATENT DOCUMENTS

| | | |
|---|---|---|
| CN | 1348509 A | 5/2002 |
| CN | 101874283 A | 10/2010 |

(Continued)

OTHER PUBLICATIONS

International Search Report, dated May 27, 2013, International Application No. PCT/EP2012/070535, pp. 1-3, European Patent Office, Rijswijk, The Netherlands.

*Primary Examiner* — Tung X Le
(74) *Attorney, Agent, or Firm* — Brinks Gilson & Lione (57) ABSTRACT

An apparatus for generating a hollow cathode arc discharge plasma, including two plasma sources, each including a hollow cathode and an electrode which is associated with the hollow cathode and which has an opening that extends through the electrode, wherein the hollow cathodes of the two plasma sources are connected to a pulse generator which generates a bipolar, medium-frequency pulsed voltage between the two hollow cathodes. Here, in each of the two plasma sources, the hollow cathode is connected in an electrically conducting manner, directly or with interconnection of at least one current direction limiting component, to the associated electrode.

14 Claims, 4 Drawing Sheets

(52) U.S. Cl.
CPC .... *H01J37/32596* (2013.01); *H01J 37/32669* (2013.01); *H01J 37/32807* (2013.01); *H05H 1/48* (2013.01); *H01J 2237/0822* (2013.01); *H01J 2237/152* (2013.01); *H01J 2237/327* (2013.01)

(56) References Cited

U.S. PATENT DOCUMENTS

| | | | |
|---|---|---|---|
| 5,330,800 A * | 7/1994 | Schumacher | H01J 37/32412 427/523 |
| 5,635,087 A | 6/1997 | Schiller et al. | |
| 5,846,608 A | 12/1998 | Neumann et al. | |
| 6,045,667 A * | 4/2000 | Moll | 204/192.38 |
| 6,368,678 B1 * | 4/2002 | Bluck et al. | 427/569 |
| 6,444,945 B1 * | 9/2002 | Maschwitz | C23C 14/243 118/723 E |
| 6,447,837 B2 | 9/2002 | Plester et al. | |
| 6,541,915 B2 * | 4/2003 | Eden | H05B 41/19 313/491 |
| 9,028,660 B2 | 5/2015 | Bellido-Gonzalez | |
| 2008/0029717 A1 * | 2/2008 | Shirai | H05G 2/003 250/504 R |
| 2008/0308410 A1 * | 12/2008 | Teschner et al. | 204/192.12 |

FOREIGN PATENT DOCUMENTS

| | | |
|---|---|---|
| DE | 4235199 C1 | 4/1993 |
| DE | 19546827 A1 | 6/1997 |
| DE | 19612344 C1 | 8/1997 |
| DE | 19902146 A1 | 8/2000 |
| DE | 19902146 C2 | 7/2003 |
| DE | 102006027853 A1 | 12/2007 |
| DE | 102008047198 A1 | 4/2010 |
| EP | 1094130 A2 | 4/2001 |
| WO | WO2009/022184 A2 | 2/2009 |

* cited by examiner

Fig. 4 though the area of the plasma activation of the vapor is located outside of the electrical field built up between the hollow cathode and the anode, there is the disadvantage that only clearly lower charge carrier densities in the plasma can be generated than with arrangements that enclose the area to be activated between the hollow cathode and the anode. In addition, the range of the beam electrons delimits the geometric extent of the plasma.

APPARATUS FOR GENERATING A HOLLOW CATHODE ARC DISCHARGE PLASMA

CROSS-REFERENCE TO RELATED APPLICATIONS

This application is a national stage entry of International Patent Application PCT/EP2012/070535, filed Oct. 17, 2012, entitled "VORRICHTUNG ZUM ERZEUGEN EINES HOHLKATHODENBOGENENTLADUNG-SPLASMAS," the entire contents of which are incorporated by reference, which in turn claims priority to German patent application 102011121386.8, filed Dec. 19, 2011, the entire contents of which are incorporated by reference.

BACKGROUND

The invention relates to an apparatus for generating dense plasmas for vacuum processes using alternating polarity pulsed hollow cathode arc discharge sources.

It is known that in the low-pressure range between $10^{-2}$ Pa and 1 Pa very high charge carrier densities on the order of magnitude of $10^{12}$ cm$^{-3}$ can be achieved with hollow cathode arc discharge plasmas. If, during layer deposition, the layer-forming particles are exposed to such a plasma, advantageous coating properties can be achieved.

For this purpose, apparatuses are known in which the vapor can be activated effectively by using the hollow cathode plasma exclusively for the plasma activation, in particular for larger coating areas and high coating rates. The plasma discharges of these apparatuses are operated using direct current. In such apparatuses, the anodes required in addition to the hollow cathodes for plasma generation are partially connected to the vaporization device (DE 196 12 344 C1). The utilization of the vaporization crucible or of an electrode arranged as an anode close to the vaporization crucible has the disadvantage that the functional capability of the apparatuses is limited to a plasma activation associated with the vaporization of electrically conducting materials.

Moreover, it is known to guide the plasma by means of a magnetic field. If appropriate magnetic field-generating devices generate a longitudinal magnetic field so that a number of its field lines lead from the hollow cathode to the anode, higher-energy beam electrons on their way from the hollow cathode to the anode remain bound in the range of the connecting field lines and they keep the high-density plasma a certain distance from the substrate (DE 42 35 199 C1). A disadvantage here is that, by keeping the higher-energy beam electrons away from the substrate, the buildup of a high self-bias potential is prevented. An additional disadvantage is that the usability remains limited to special designs of the vaporization device with expensive magnetic systems. In addition, in the case of vaporization of insulating materials, a high apparatus cost is required in order to maintain the electrical conductivity at the anode.

DE 195 46 827 A1 describes an apparatus for the vaporization of insulating materials, in which a ring-shaped anode (a so-called ring anode) is arranged directly before the hollow cathode in order to generate effective plasma for the plasma activation exclusively by the beam electrons that have passed through the opening of the ring anode. In this case, no interfering insulating layers are deposited on the ring anode, because the latter is located substantially outside of the vapor region and the ring anode is strongly heated as a result of the impinging beam electrons. However, since the area of the plasma activation of the vapor is located outside of the electrical field built up between the hollow cathode and the anode, there is the disadvantage that only clearly lower charge carrier densities in the plasma can be generated than with arrangements that enclose the area to be activated between the hollow cathode and the anode. In addition, the range of the beam electrons delimits the geometric extent of the plasma.

In DE 199 02 146 A1, it is proposed to arrange two plasma-generating devices known from the aforementioned patent application, each including a hollow cathode with associated ring anode and a direct current voltage source connected in between, so that they are located opposite each other and generate a bipolar, medium-frequency pulsed voltage between the two hollow cathodes. In this arrangement, due to the direct current voltage source between the hollow cathode and the ring anode, there is always plasma generated between the hollow cathode and the associated ring anode of a plasma-generating device. In the phases in which one of the two plasma-generating devices is connected cathodically due to the bipolar voltage pulse, the plasma of the cathodically connected plasma-generating device is drawn by its hollow cathode to the ring anode of the opposite plasma-generating device. In this manner, a large-volume hollow cathode arc discharge plasma forms between the two ring anodes. The disadvantage of this technically demanding construction is that numerous process parameters have to be adjusted to achieve constant plasma conditions.

SUMMARY

The invention is therefore based on the technical problem of providing an apparatus for generating a hollow cathode arc discharge plasma, by means of which the disadvantages of the prior art can be overcome, and in particular, the aim is for the apparatus to be capable of generating both a plasma having a high intensity and also a plasma having a large volume. Furthermore, the apparatus should be characterized, in comparison to the prior art, by a technically simplified construction, and it should be able to generate a stable plasma even in application cases involving an ambient pressure of up to 100 Pa.

The invention relates to an apparatus for generating dense plasmas for vacuum processes using alternating polarity pulsed hollow cathode arc discharge sources in reactive or non-reactive coating applications. In addition to the coating of stationary substances, the apparatus also allows the coating of moving strip-shaped substrates. The apparatus is suitable for use in rare gas and reactive gas atmospheres and thus also for surface treatments and for plasma etching processes. When, in the following description of the invention, only the term hollow cathode is used, it always refers to the hollow cathode of a hollow cathode arc discharge source. The invention is thus limited to apparatuses in which a hollow cathode glow discharge source is used.

DETAILED DESCRIPTION

An apparatus according to the invention includes two plasma-generating devices, which are arranged opposite each other. Each one of the two plasma-generating devices includes a hollow cathode having a tube through which a working gas flows, and an electrode which has an opening that extends through the electrode. The opening of a cathode tube, out of which the working gas flows, is referred to below as the discharge or outlet opening of the hollow cathode.

In an embodiment, the electrode is arranged before the discharge opening of the hollow cathode. Alternatively, the cathode tube can, however, also protrude with its discharge opening side into the opening of the associated electrode or the cathode tube can protrude completely through the opening of the associated electrode. Here, the cathode tube protruding through the opening of the electrode can be in mechanical contact with the electrode or, in an alternative embodiment, can be a distance from the electrode.

Such an electrode is preferably designed as a ring-shaped electrode and arranged so that the extended axes of the hollow cathode tube and of the ring electrode are identical.

The outlet openings of the two hollow cathodes of an apparatus according to the invention are opposite each other. Here, the two plasma-generating devices (hereafter also referred to as plasma sources or as plasma source in the singular) are arranged opposite each other so that the extended tube axes of the two hollow cathode tubes are identical. Alternatively, the tube axes of the two hollow cathode tubes can also form an angle with respect to one another.

An apparatus according to the invention furthermore includes a pulse generator, which is electrically connected to the two hollow cathodes and which generates a bipolar, medium-frequency pulsed electrical voltage between the two hollow cathodes. The pulses here can have a frequency in a range from 1 Hz to 1 MHz. In order to prevent decay of the plasma generated between the two hollow cathodes in the case of a polarity change, the polarity change should be carried out at a frequency of at least 1 kHz. Therefore, it has been found to be advantageous if the pulse generator is operated at a frequency in the range from 1 kHz to 100 kHz.

In the prior art, plasma-generating devices having the features described so far also have a direct current voltage source which is connected between the hollow cathode and the electrode (designed as an anode in the prior art) arranged before the hollow cathode outlet opening. This direct current voltage source ensures that a plasma steadily fires between the hollow cathode and the electrode arranged before the hollow cathode.

An apparatus according to the invention, on the other hand, does not have such a direct current voltage source between a hollow cathode and the associated electrode. Instead, in an apparatus according to the invention, the hollow cathode that is part of a plasma-generating device is connected in an electrically conducting manner to the associated electrode.

An apparatus according to the invention is ignited by providing ignition pulses by means of the pulse generator that have an ignition voltage which is a multiple of the firing voltage. The ignition voltage can here be 10 times or even 50 times the value of the firing voltage. For the ignition of an apparatus according to the invention, depending on the configuration of the apparatus, voltages in a range from 100 V to 5000 V can be required. The bipolar ignition voltage pulses of the pulse generator first produce a glow discharge between the two plasma-generating devices, as a result of which the two hollow cathodes are heated until the glow discharge transitions into a hollow cathode arc discharge. The arc discharge burns here from the respective cathodically connected hollow cathode primarily toward the electrode of the opposite, anodically connected plasma source. The anodic phases of a plasma source are also the reason why the electrodes, which are indeed at the same electrical potential as the associated hollow cathode, are needed. The surface area of an anodically connected hollow cathode alone is insufficient to extract from the plasma the number of electrons per unit of time that is required to maintain a high arc current. The electrode that is part of a plasma source is thus used only to increase the anode surface area in the anodic phases of a plasma-generating device.

As already mentioned once above, the electrode of a plasma-generating device can be arranged before the outlet opening of the associated hollow cathode, so that the extended axis of the hollow cathode tube extends through the opening of the electrode. Since, in an apparatus according to the invention, the electrode contributes substantially only to increasing the surface area in the anodic phases and no arc discharge fires between hollow cathode and associated electrode, in an alternative embodiment the cathode tube itself can also extend through the opening of the electrode. Here, the electrode ring can be a distance from the cathode tube, or it can also be in mechanical contact with the cathode tube. If the electrode is in mechanical contact with the hollow cathode, the electrically connecting contacting of the two components is dispensed with. However, a disadvantage here is that thermal energy which is needed for heating the hollow cathode is dissipated into the electrode material. The situation is reversed correspondingly if the hollow cathode tube extending through the opening of the electrode is a distance from the electrode. In that case, less thermal energy is dissipated from the hollow cathode into the electrode material; however, in addition, an electrically connecting contacting of the two elements is required.

For the sake of completeness, it is also mentioned that, after the ignition of an arc discharge between the two plasma-generating devices, the voltage of the pulses generated by the pulse generator is reduced from the level of the ignition voltage to a firing voltage known from the prior art. It is possible to use, for example, a pulse generator known from DE 10 2008 047 198 A1, as pulse generator that is capable of providing both the ignition voltage pulses and also a firing voltage. The pertinent disclosure content known from DE 10 2008 047 198 A1 is hereby also included in its entirety by reference.

However, it is precisely in an ignition phase, in which a glow discharge between the two plasma-generating devices is generated and the two hollow cathodes first still have to be heated, that the effect of hollow cathode and associated electrodes having the same voltage potential is negative. In the cathodic phases of a plasma source, the cathode current then flows not only through the hollow cathode of the cathodically connected plasma source but also through the associated electrode. Thus, only a reduced heating current is available to the hollow cathode, as a result of which the heating of the hollow cathode is delayed.

Therefore, it has been found to be advantageous if a current direction limiting component, such as a diode, for example, is connected, between a hollow cathode and the associated electrode. Then, in the anodic phases, hollow cathode and associated electrode have the same voltage potential, whereas in the cathodic phases, due to the voltage drop across the current direction limiting component, there is a voltage difference between hollow cathode and associated electrode, as a result of which the thermal current flowing via the hollow cathode is increased in comparison to an embodiment without current direction limiting component.

As already mentioned above, the ignition of an apparatus according to the invention requires ignition pulses having a very high voltage. The level of the ignition voltage can be reduced if each plasma-generating device is enclosed by a separate magnetic coil. This means that the electrode and at least one terminal area of the cathode tube together with the outlet opening of the hollow cathode that is associated with the electrode are enclosed by the magnetic coil. Preferably, such a magnetic coil has a ring-shaped design and is arranged rotationally symmetrically around the hollow cathode tube.

Magnetic coils of such a design, in the glow discharge mode, bring about a reduction of the plasma impedance, as a result of which the voltage level of the pulses during the ignition phase can be decreased. Here, the following relation exists: the higher the magnetic field strength is, the lower the voltages are required for the pulses in the ignition phase. Conversely: the higher the voltages are used, the lower the selected magnetic field strength of a magnetic coil enclosing a plasma source can be. However, using simple laboratory tests, it is possible to determine which magnetic field strength is required for a given maximum voltage pulse level or which voltage pulse level is required for a given maximum magnetic field strength in order to achieve the reliable ignition of an arc discharge, depending on the particular installation configuration.

The two magnetic coils, in terms of their polarity, can be arranged so that their magnetic field lines extend in the same direction. In this embodiment, plasma of very high intensity is generated in the central area between the two hollow cathodes. During the ignition of an apparatus according to the invention in particular, the magnetic fields of the two magnetic coils should have the same direction, since this simplifies the ignition of the apparatus.

In an alternative embodiment, the two magnetic coils, in terms of their polarity, are arranged so that their magnetic field lines are in opposite direction. In this embodiment, the overlapping magnetic fields of the two plasma-generating devices lead to an overall magnetic field that generates plasma with a larger volume between the hollow cathodes, but which has a lower intensity than the plasma of the above-described embodiment, with the other installation parameters otherwise unchanged.

From DE 10 2006 027 853 A1, a plasma source based on a hollow cathode is known, in which, after the ignition of an arc discharge, the amount of flow of the working gas through the hollow cathode is reduced until an increase in the plasma intensity is observed. An apparatus according to the invention can also be operated using this procedure, thereby generating plasma of even higher intensity. The pertinent disclosure content known from DE 10 2006 027 853 A1 is hereby included in its entirety by reference.

Embodiment Example

The invention is explained in further detail below in reference to embodiment examples.

Figure 1:
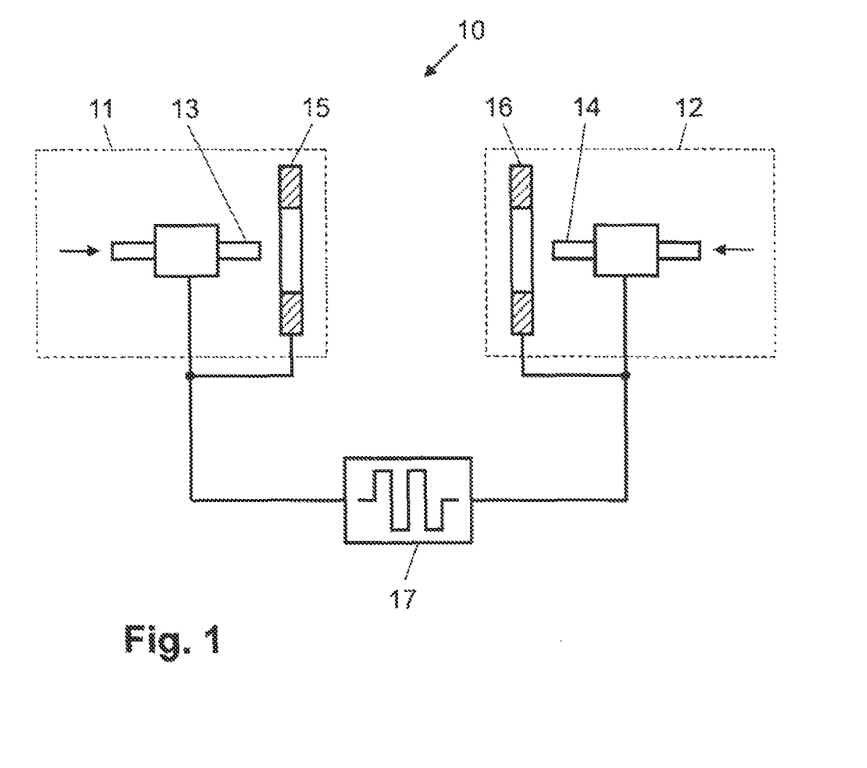
FIG. 1 shows a diagrammatic representation of an apparatus according to the invention.

In FIG. 1, an apparatus 10 according to the invention is diagrammatically represented. Apparatus 10 includes two plasma-generating apparatuses 11 and 12, each including a hollow cathode 13, 14 and an associated electrode 15, 16. The two electrodes 15, 16 have a ring-shaped design and they are arranged before the outlet opening of the respective associated hollow cathode 13, 14 so that the extended axes of the hollow cathode tube and of the electrode ring are identical. The arrows behind the hollow cathodes 13, 14 indicate the direction of flow in which a working gas flows through the tube of a respective hollow cathode 13, 14.

In the plasma source 11, the hollow cathode 13 and the electrode 15 are connected in an electrically conducting manner to one another, just as in the plasma source 12 the hollow cathode 14 is connected in an electrically conducting manner to the associated electrode 16. A pulse generator 17 is electrically connected to the two hollow cathodes 15, 16 and it generates, between the two plasma sources 11, 12, a bipolar pulsed voltage at a frequency of 10 kHz.

In the ignition phase of the apparatus 10, voltage pulses of up to 1800 V are generated by means of the pulse generator 17. Consequently, a glow discharge is produced first between the two plasma sources 11 and 12. The electrical current that flows here through the hollow cathodes 13 and 14 heats the hollow cathodes 13, 14 up to an electron emission temperature at which the glow discharge transitions into the arc discharge, and thus a hollow cathode arc discharge plasma is generated between the plasma sources 11 and 12. At this time, the pulses generated by the pulse generator 17 are decreased to a firing voltage of approximately 60 V. In the process, in the phases in which the plasma source 11 is connected cathodically, the arc discharge fires substantially from the hollow cathode 13 to the electrode 16. In the phases in which the plasma source 12 is cathodically connected, the arc discharge fires substantially from the hollow cathode 14 to the electrode 15. Due to the fact that, in a apparatus according to the invention, an arc discharge always fires between the hollow cathode of a plasma source and the electrode of an opposite plasma source, the electrode of the opposite plasma source, which is connected as an anode, results in a secondary acceleration of the electrons in the plasma, which has an advantageous effect particularly in application cases with elevated ambient pressure (up to 100 Pa), since, at high pressure, the mean free path lengths of the electrons are greatly shortened.

Figure 2:
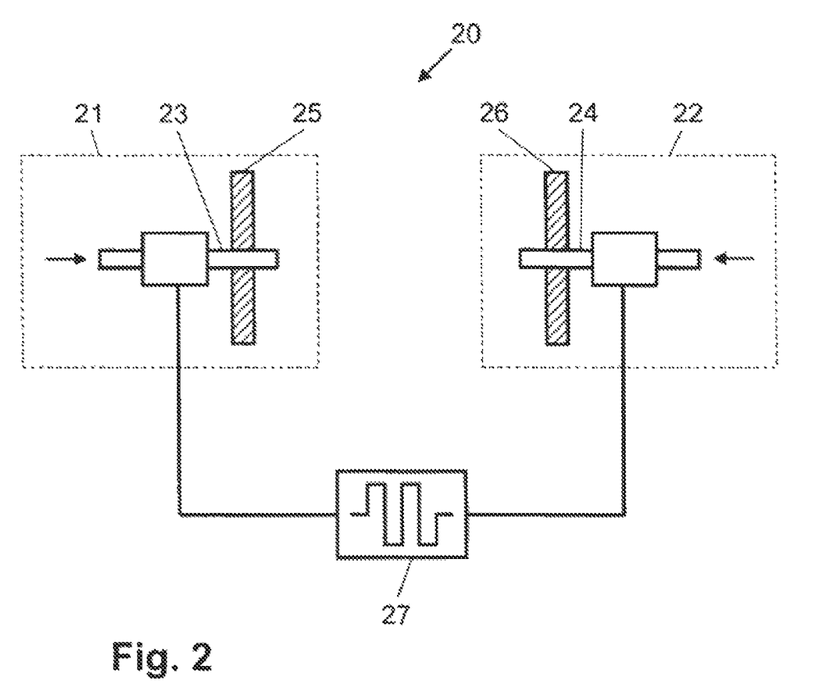
FIG. 2 shows a diagrammatic representation of an alternative apparatus according to the invention.

In FIG. 2, an alternative apparatus 20 according to the invention is diagrammatically represented. Apparatus 20 includes two plasma-generating apparatuses 21 and 22, each of which includes a hollow cathode 23, 24 and an associated electrode 25, 26. The two electrodes 25, 26 have a ring-shaped design and they are attached to the tube of the respective associated hollow cathode 23, 24. Hollow cathode and associated electrode as a result are in mechanical contact and they do not require any additional electrical contacting. The arrows behind the hollow cathodes 23, 24 here also give the direction of flow in which the working gas flows through the tube of a respective hollow cathode 23, 24.

A pulse generator 27 is connected to the two hollow cathodes 25, 26 and it generates a bipolar pulsed voltage between the two plasma sources 21, 22. The parameters and the operation of the pulse generator 27 for the ignition and maintenance of an arc discharge between the two plasma sources 21, 22 are identical to the corresponding parameters of the pulse generator 17 of FIG. 1. In this embodiment as well, an arc discharge burns between the hollow cathode of a plasma source and the electrode of the other plasma source.

Figure 3:
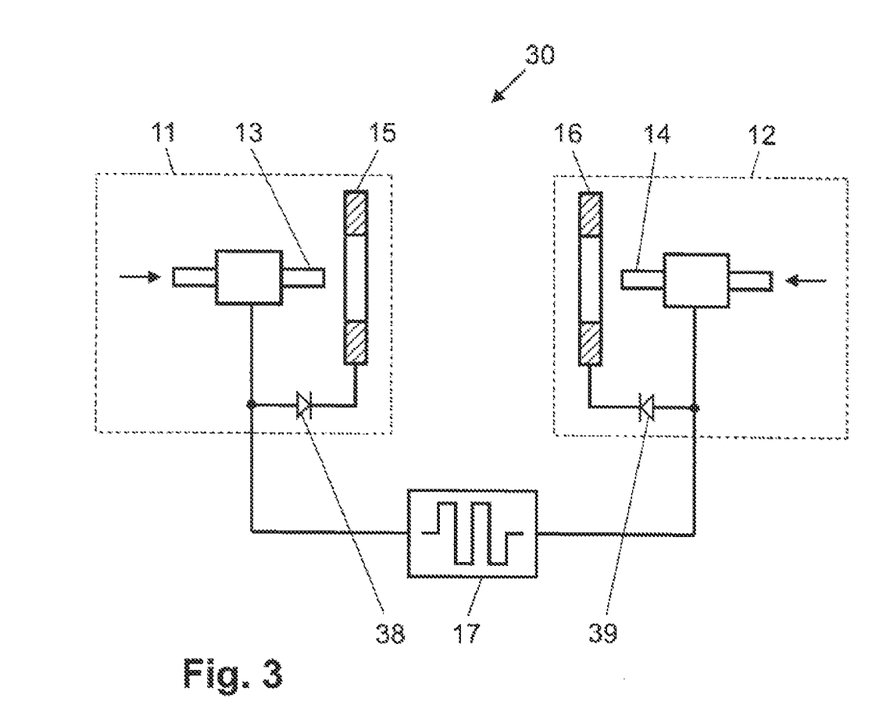
FIG. 3 shows a diagrammatic representation of an additional alternative apparatus according to the invention.

An additional alternative embodiment of an apparatus 30 according to the invention is diagrammatically represented in FIG. 3. Apparatus 30 is similar to the apparatus 10 represented in FIG. 1 except for one technical detail. In FIG. 3, the two plasma-generating devices 11 and 12 additionally also each include a diode 38 or 39, which is connected between the hollow cathode and the associated electrode of a respective plasma source. The diodes 38 and 39 produce, in the cathodic phases of a plasma source, a voltage drop and thus they have the effect that the hollow cathode and the associated electrode of the cathodically connected plasma source have a different electrical potential. Accordingly, the cathode current flowing via the hollow cathode is increased, as a result of which the cathode is heated better the current discharge than without interconnected diode. This can be observed particularly in a shortened ignition of the apparatus 30 compared to the apparatus 10 represented in FIG. 1.

Figure 4:
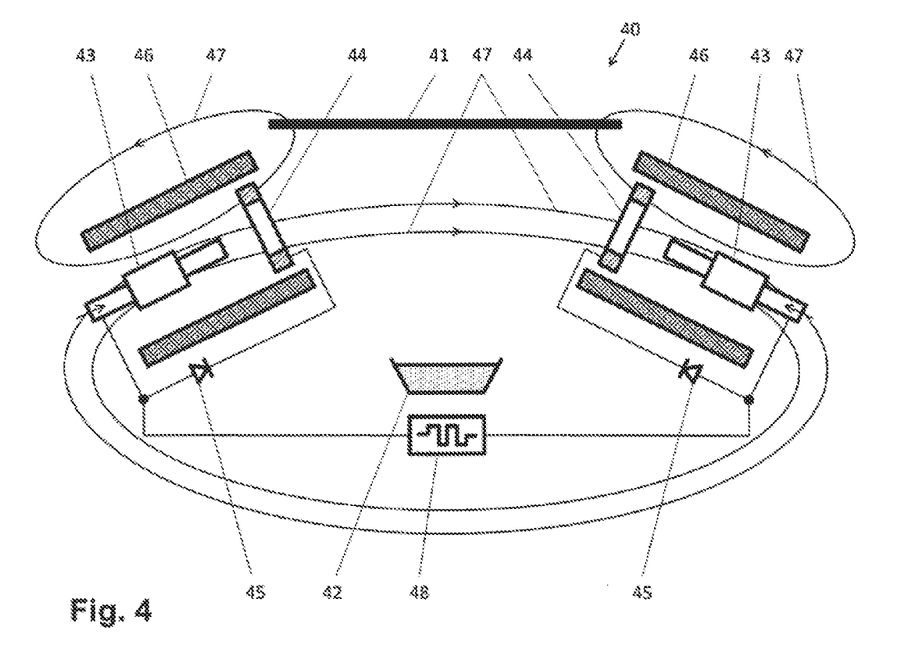
FIG. 4 shows a diagrammatic representation of an installation for vacuum vaporization of a substrate using an integrated apparatus according to the invention.

In FIG. 4, an installation 40 working under vacuum conditions is represented, by means of which one side of a strip-shaped substrate 41 is to be vapor coated. For this purpose, a material located in a vessel 42 is heated in such a manner that the material is vaporized, and the rising material vapor is deposited on the side of the substrate 41 turned toward the vessel 42. In order to achieve desired coating properties, it is necessary for the rising material vapor to be penetrated by high-intensity plasma. To generate this plasma, an apparatus according to the invention is integrated in the installation 40.

The apparatus according to the invention includes two identical plasma-generating devices that are arranged opposite one another, each of which includes as components a hollow cathode 43, a ring-shaped electrode 44 arranged before the hollow cathode 43, and a diode 45 connected between hollow cathode 43 and electrode 44. In addition to the embodiments represented above in FIGS. 1 to 3, each one of the plasma sources represented in FIG. 4 also includes a magnetic coil 46, which rotationally symmetrically encloses the hollow cathode 43 and the associated electrode 44 of a plasma source. The extended axes of hollow cathode 43, electrode 44 and magnetic coil 46 of a plasma source are accordingly identical. This axis is also referred to below as the axis of a plasma source.

The two magnetic coils 46 are excited in the same direction and they generate a magnetic guide field 47. The latter transitions with increasing distance from the hollow cathodes 43 into a stray magnetic field. The upper portion of the field lines leads to the substrate 41. The axes of the two plasma sources represented opposite one another in FIG. 4 here form an angle with respect to one another. Here, the hollow cathodes 43 are aligned so that the directed portion of the plasma electrons is guided by the magnetic guide field 47 partially toward the substrate 41 and partially closely past the substrate 41 to the ring electrode 44 of the opposite plasma source. The portion of the directed electrons that impinges with the substrate 41 generates, on insulating surfaces, a highly negative self-bias voltage, which confers additional energy to the condensing ions as a result of the acceleration in the electrostatic sheath. The shape of the magnetic field leads to a field strength gradient from the area of the closed field lines to the substrate 41. This gradient also has the effect of accelerating the ions out of the plasma, which leads to an increased ion current density at the substrate 41 and to an additional increase of the ion energy.

The pulse generator 48 connected between the two hollow cathodes 43 generates both the bipolar pulses for the ignition of the arc discharges between the two plasma sources and also the bipolar pulses at the voltage level of the firing voltage. As in the case of the pulse generators in all the embodiments of apparatuses according to the invention, pulse generator 48 as well can generate both symmetric and also asymmetric bipolar pulses having variable duty cycles.

The form of plasma sources of an apparatus according to the invention, which is shown in FIG. 4 and which includes a hollow cathode, a ring electrode arranged in front of said hollow cathode, a current direction limiting component connected between hollow cathode and ring electrode, and a magnetic coil arranged rotationally symmetrically around hollow cathode and ring electrode, constitutes a preferred embodiment. This construction, in comparison to the prior art in which a direct current voltage source is connected between hollow cathode and local anode, is easier to implement technically and, as a result of the omission of the direct current voltage source, fewer parameters also need to be adjusted. Furthermore, an arc discharge between the plasma sources of this embodiment can be fired rapidly and reliably. Moreover, depending on the polarity of the opposite magnetic coils, high-intensity volume-based concentrated plasma and also large-volume plasma can be generated.

The invention claimed is:

1. Apparatus for generating a hollow cathode arc discharge plasma, comprising two plasma sources, each including a hollow cathode and an electrode which is associated with the hollow cathode and which has an opening that extends through the electrode, wherein the hollow cathodes of the two plasma sources are connected to a pulse generator, which generates a bipolar, medium-frequency pulsed voltage between the two hollow cathodes, wherein, in the two plasma sources, the hollow cathode is electrically connected directly to the associated electrode or the hollow cathode is electrically connected directly to a first node of a current direction limiting component and a second node of the current direction limiting component is electrically connected directly to the associated electrode.

2. Apparatus according to claim 1, wherein the electrode is arranged before the outlet opening of the associated hollow cathode.

3. Apparatus according to claim 1, wherein the tube of the hollow cathode protrudes through the opening of the associated electrode.

4. Apparatus according to claim 3, wherein the hollow cathode is in mechanical contact with the electrode.

5. Apparatus according to claim 1, wherein the electrode has a ring-shaped design.

6. Apparatus according to claim 5, wherein the extended axes of the hollow cathode and of the ring-shaped electrode are identical.

7. Apparatus according to claim 1, wherein each plasma source includes a separate magnetic coil which encloses the hollow cathode and the associated electrode.

8. Apparatus according to claim 7, wherein the magnetic coil has a ring-shaped design.

9. Apparatus according to claim 8, wherein the extended axes of the ring-shaped magnetic coil and of the tube of the hollow cathode are identical.

10. Apparatus according to claim 1, wherein the bipolar, medium-frequency pulsed voltage has a frequency in the range from 1 Hz to 1 MHz.

11. Apparatus according to claim 10, wherein the bipolar, medium-frequency pulsed voltage has a frequency in the range from 1 kHz to 100 kHz.

12. Apparatus according to claim 1, wherein the current direction limiting component is a diode.

13. A system for generating a hollow cathode arc discharge plasma, comprising two plasma sources, each including a hollow cathode and an associated electrode having an opening, the hollow cathode extending through the opening of the associated electrode or having an opening that faces the associated electrode, wherein the hollow cathodes of the two plasma sources are connected to a pulse generator configured to generate an alternating pulsed voltage between the hollow cathodes, wherein, in each of the two plasma sources, the hollow cathode is electrically connected directly, or directly through at least one current direction limiting component to the associated electrode, wherein the at least one current direction limiting component permits a flow of current from the hollow cathode to the associated electrode and limits a flow of current from corresponding anode to the hollow cathode, wherein, in each of the two plasma sources, the hollow cathode and the associated electrode are configured to operate together as a cathode to the other of the two plasma sources and, alternatively, as an anode to the other of the two plasma sources depending on the alternating pulsed voltage.

14. The system of claim 13, wherein, in each of the plasma sources, the hollow cathode is configured to be at the same electrical potential as the associated electrode.

* * * * *